United States Patent [19]

Fodali et al.

[11] Patent Number: 4,853,625
[45] Date of Patent: Aug. 1, 1989

[54] ELECTRIC WIRE CLIP

[75] Inventors: Adolph Fodali, Lake Hiawatha; George Gering, Short Hills, both of N.J.

[73] Assignee: S & G Tool Aid Corp., Newark, N.J.

[21] Appl. No.: 197,508

[22] Filed: May 23, 1988

[51] Int. Cl.$^4$ .......... G01R 1/06; G01R 1/067
[52] U.S. Cl. .............. 324/158 P; 324/72.5; 324/149; 439/482
[58] Field of Search .......... 324/72.5, 158 P, 149, 324/158 F; 81/418, 426.5; 439/482

[56] References Cited

U.S. PATENT DOCUMENTS

| | | | |
|---|---|---|---|
| 2,291,413 | 7/1942 | Siebrandt | 81/418 |
| 2,408,045 | 9/1946 | Cottrell | 324/72.5 |
| 3,363,171 | 1/1968 | Sietmann et al. | |
| 3,626,358 | 12/1971 | Klassen | 324/72.5 |
| 3,662,259 | 5/1972 | Dapilito | |
| 3,698,419 | 10/1972 | Tura | 81/418 |
| 3,864,629 | 2/1975 | Danna | |
| 4,649,634 | 3/1987 | Mykkanen | 81/426.5 |
| 4,709,206 | 11/1987 | Edwards et al. | 324/72.5 |

Primary Examiner—Reinhard J. Eisenzopf
Assistant Examiner—W. Burns
Attorney, Agent, or Firm—James & Franklin

[57] ABSTRACT

For use with a circuit tester having a pointed probe tip, the clip has a "U"-shaped configuration formed of first and second moveably connected wire clamping elements which define a recess. The elements are spreadable to accept the wire and biased toward a closed position to retain the wire securely within aligned channels provided for this purpose. Openings extend through the elements and intersect the channels to permit a pointed probe tip to extend through the clip, pierce the wire insulation and contact the wire. Finger grip portions, extending from the elements, may be provided to facilitate spreading of the elements. The clip may be formed of a single flexible molded plastic part or may be two rigid parts, hingedly connected and spring loaded towards the closed position.

16 Claims, 3 Drawing Sheets

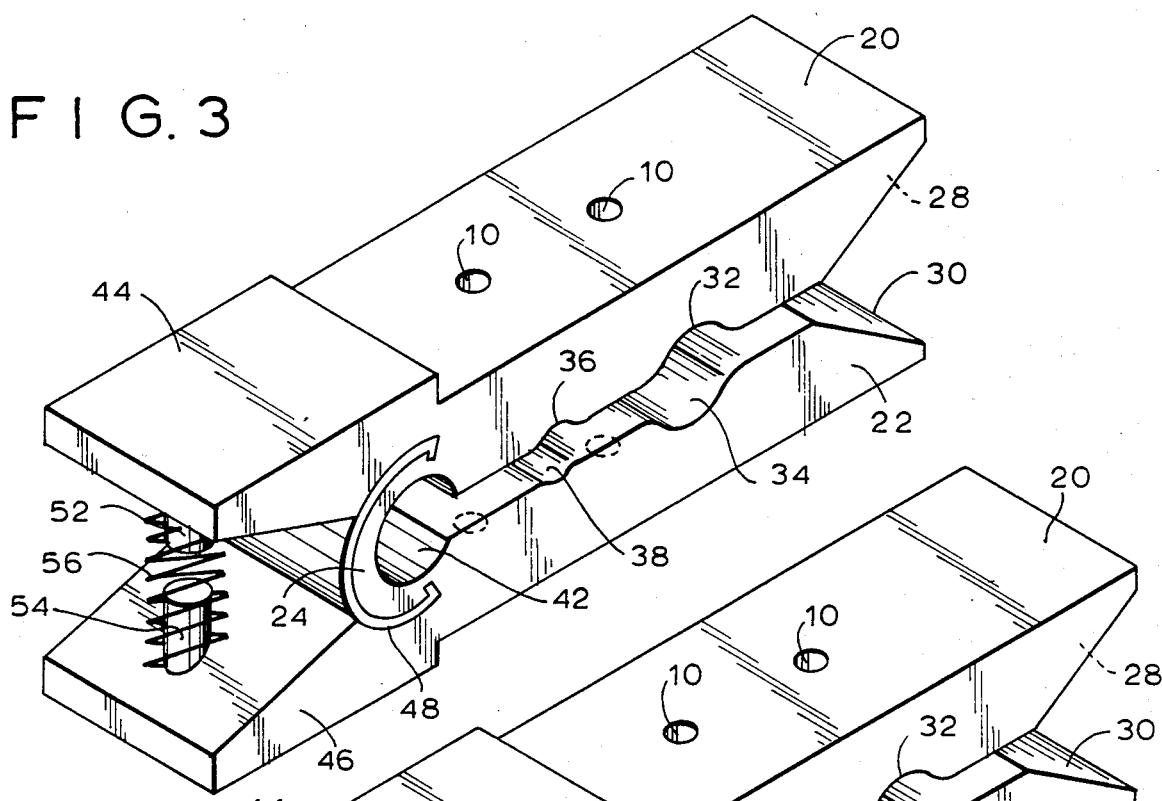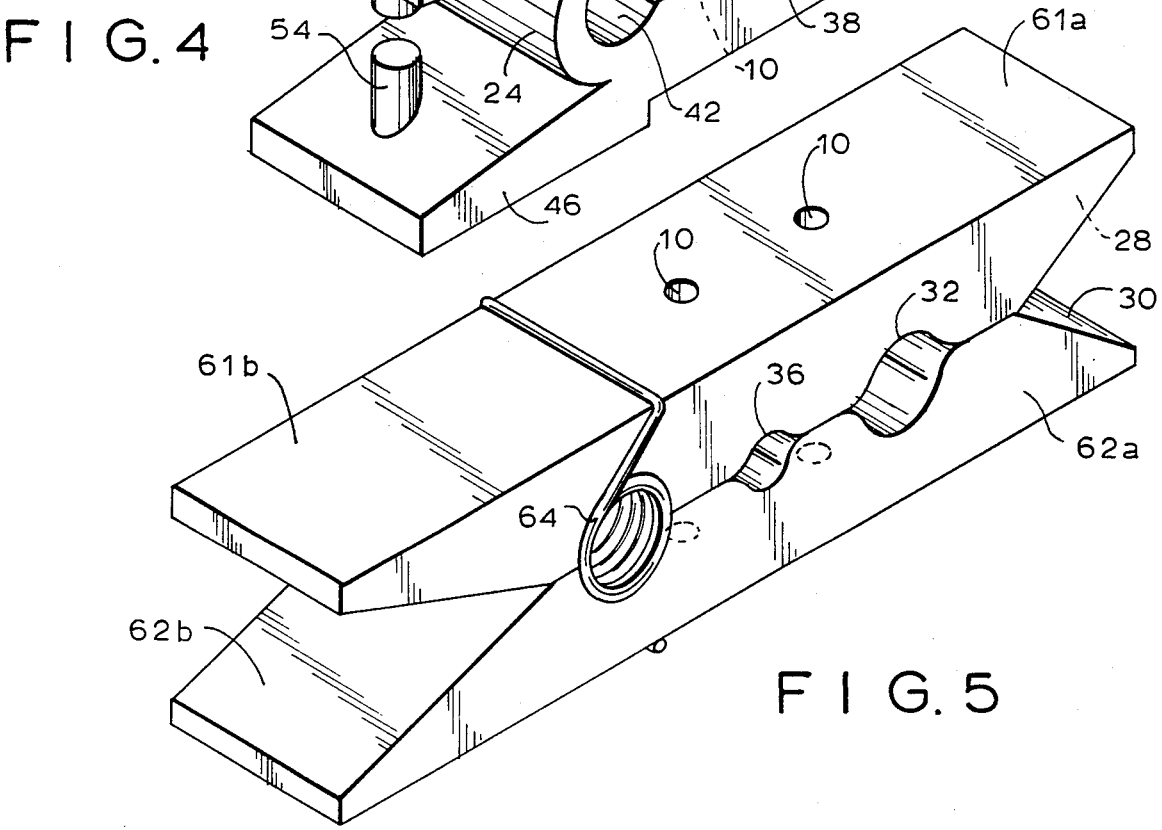

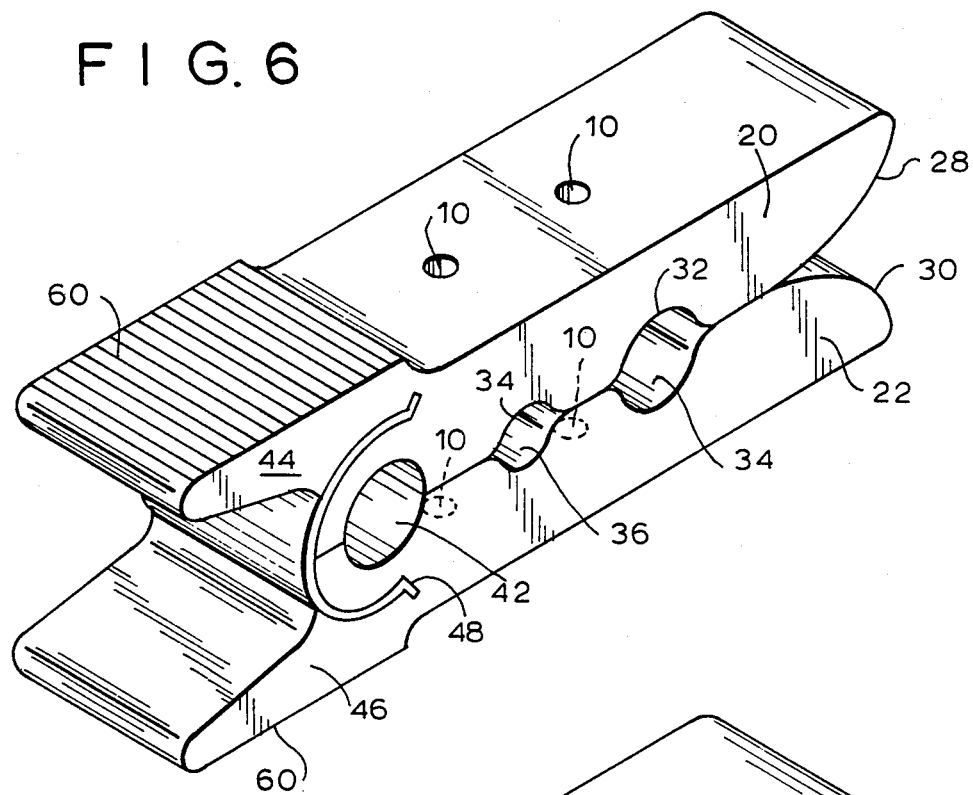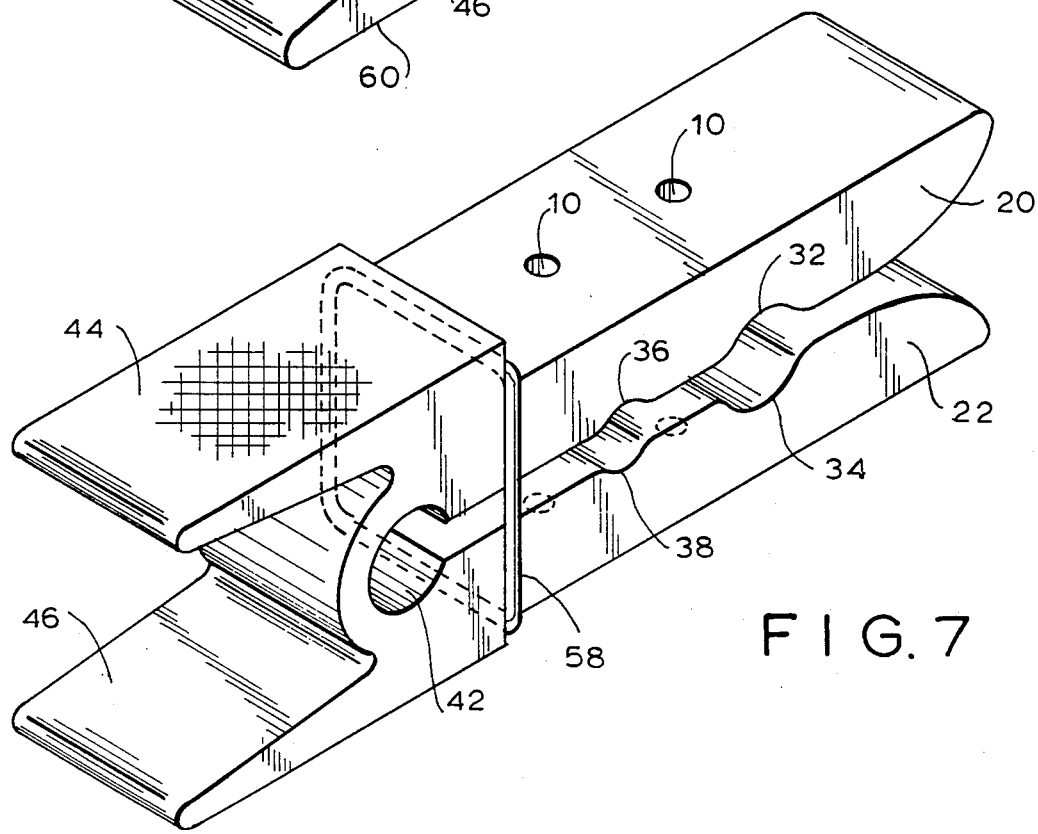

ELECTRIC WIRE CLIP

The present invention relates to electrical circuit test devices and more particularly to an electric wire clip designed for use with a hand held electric circuit continuity tester of the type having a pointed probe tip.

Electric circuit continuity testers are commonly utilized to test circuit continuity in a variety of different applications. It is often necessary, during such test procedures, to make electric contact with an insulated wire. For this purpose, the tester is provided with a pointed probe tip designed to facilitate penetration of the wire insulation.

To penetrate the wire insulation, a reasonable amount of force must be applied. The user must hold the wire in one hand and the probe in the other. The probe is manipulated such that the pointed probe tip is forced through the insulation to make contact with the underlying wire. This often results in missing the center of the wire such that poor contact is made or, worse, missing the wire entirely and sticking the sharp tip into the user's finger.

In order to eliminate these problems and obtain the additional capability of maintaining the probe tip in electrical contact with the wire in a manner which frees the user's hands to perform other tasks, a simple, inexpensive electric wire clip is provided. The clip acts to accurately guide the probe tip through the wire insulation and into the center of the wire. It virtually eliminates the possibility of pricking the finger. Further, the clip is capable of retaining the tester, without support from the user, until the probe is removed from the clip. The clip can be easily clamped on the wire due to spreadable wire clamping elements which are biased towards the clamping position through the use of resilient materials or simple springs.

It is, therefore, a prime object of the present invention to provide an electric wire clip for use with an electric tester which will permit piercing of the wire insulation and facilitate locating of the center of the wire.

It is another object of the present invention to provide an electric wire clip for use with a tester which will prevent the pricking of a sharp probe into the user's finger.

It is another object of the present invention to provide an electric wire clip for use with a tester which will retain the tester without support from the user until it is withdrawn, so as to free the hands of the user.

It is another object of the present invention to provide an electric wire clip for use with a tester which can be manufactured from a single piece of resilient molded plastic.

It is another object of the present invention to provide an electric wire clip for use with a tester which is simple in design and inexpensive to manufacture.

In accordance with one aspect of the present invention, a clip for an electric wire, adapted for use with a circuit tester of the type having a pointed probe tip, is provided. The clip includes first and second moveably connected clamping elements defining a recess. The elements are movable relative to each other between an pen position, where the elements are spread apart, and a closed position where the elements are proximate each other and a wire may be clamped therebetween. One of the clamping elements has an opening extending therethrough and intersecting the recess. The opening is adapted to receive the pointed probe tip.

The clip further comprises means for movably connecting the clamping elements. The connecting means may include hinge means.

Means are provided for biasing the clamping elements towards the closed position. The biasing means may comprise spring means. Preferably, the elements are substantially parallel in the closed position.

The recess is defined by opposing interior surfaces of the clamping elements. A first pair of aligned channels is provided in the opposing interior surfaces and are adapted to accept a wire therein. Preferably, a second pair of aligned channels is also provided on the opposing surfaces. The second pair of channels is spaced from the first pair of channels. One of the channels is aligned with the opening.

The clip may also include finger grip portions extending from the elements, respectively. The finger grip portions are movable relative to each other from a first position, where the clamping elements are in the closed position, to a second position, where the clamping elements are in an open position.

Preferably, means are provided for limiting the relative movement of the finger grip means towards the second position. Spring means may be interposed between the finger grip means. The spring means is provided to bias the finger grip portions towards the first position.

Preferably, the clamping elements include oppositely inclined interior surface portions. These inclined surface portions facilitate the entrance of a wire into the recess.

Preferably, the elements are composed of light transmissive material. This permits the user to visually ascertain the position of the probe relative to the wire.

Elastic encircling means may be provided. The elastic encircling means are adapted to be received over the clamping elements to retain same in the closed position.

In accordance with another aspect of the present invention, an electric wire clip is provided. The clip comprises an integral body having movably connected elements defining a recess. The recess includes a wire receiving channel. The elements are normally biased towards a wire clamping position and are separable, against the bias, to permit a wire to be received in the channel. An opening is provided in at least one of the elements. The opening extends through the element and intersects the channel.

To these and such other objects which may hereinafter appear the present invention relates to an electric wire clip as described in the following specification and recited in the annexed claims taken together with the accompanying drawings where like numerals refer to like parts and in which:

FIG. 3 is a isometric view of a second preferred embodiment of the present view;

FIG. 4 is an isometric view of a third preferred embodiment of the present invention;

FIG. 5 is an isometric view of a forth preferred embodiment of the present invention;

FIG. 6 is an isometric view of a fifth preferred embodiment of the present invention; and FIG. 7 is an isometric view of a clip of the present invention which an elastic encircling ring mounted thereon.

Figure 1:
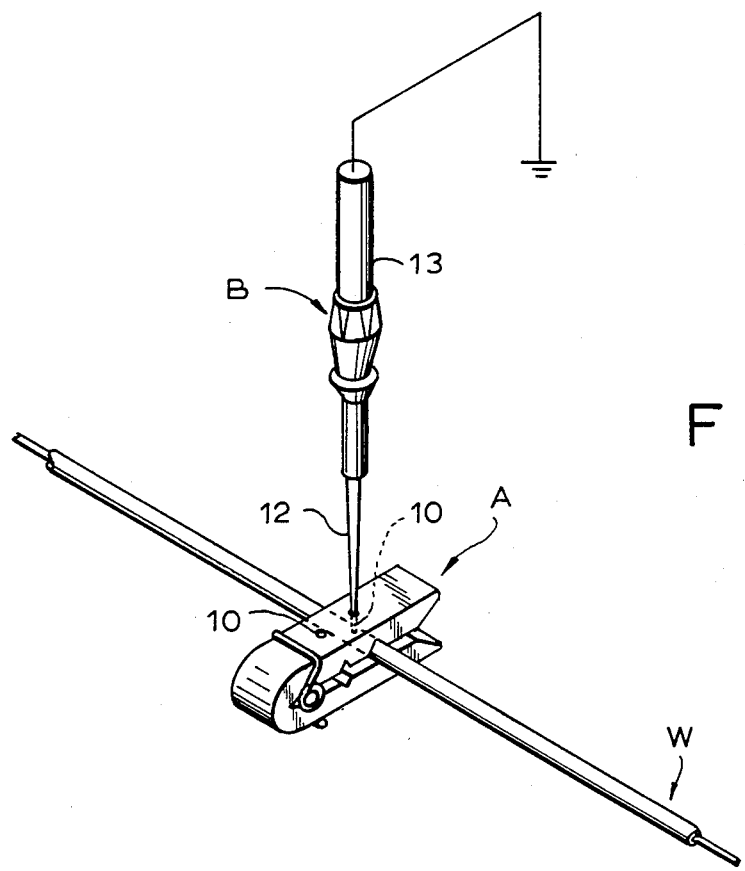
FIG. 1 is a isometric view illustrating the clip of the present invention clamped on a wire and having a circuit tester mounted thereon.

As shown in FIG. 1, the electric wire clip of the present invention, generally designed A, is designed to be clamped on an insulated wire, generally designated W, such that the body of clip A surrounds the wire W and is frictionally retained thereon. Clip A is provided with one or more openings 10 which align wire wire W. Openings 10 are adapted to receive the pointed tip of a probe 12 which extends from the handle 13 of a hand held circuit continuity tester, generally designated B.

It will be appreciated that once tester B is inserted into an opening 10 in clip A, the tester B will remain mounted to the clip, in electrical contact with wire W. Thus, the user's hands are free for other tasks. Tester B will remain in the clip until withdrawn from opening 10.

Figure 2:
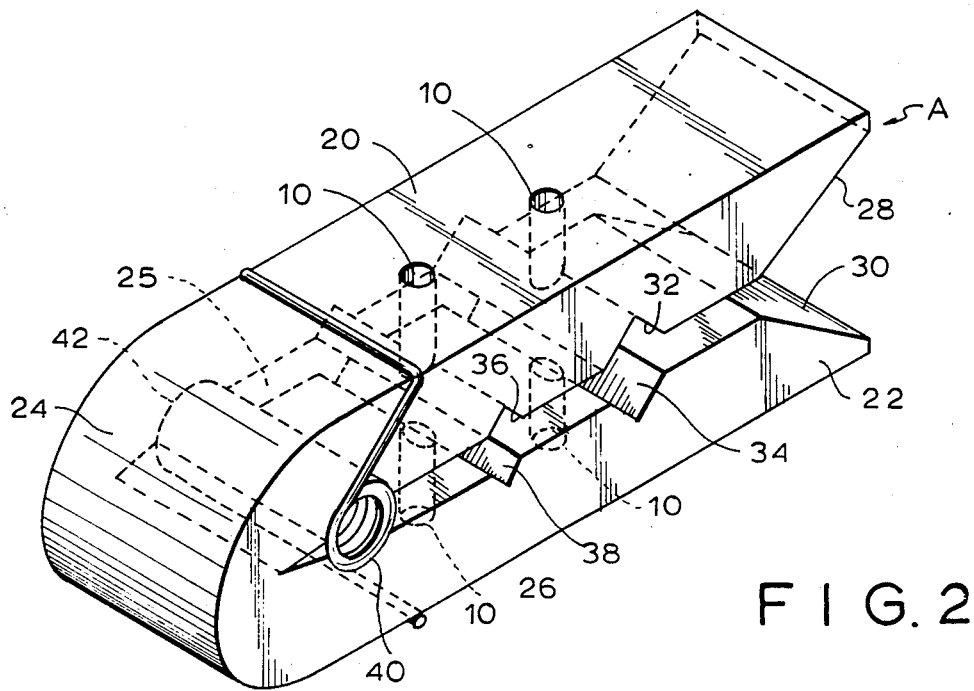
FIG. 2 is a isometric view of a first preferred embodiment of the present invention.

FIG. 2 illustrates a first preferred embodiment of the present invention. It has a substantially U-shaped configuration and is preferably comprised of a single part of resilient or flexible insulating material such as molded plastic or rubber. Preferably the material is transparent or translucent such that the interior of the clip is visible. Clip A includes a first wire clamping element 20 and a second wire clamping element 22 which are connected at 24. Clamping elements 20 and 22 define an elongated recess open at one end.

The opposing interior surfaces 25, 26 of elements 20, 22, respectively are generally normally parallel and spaced apart. At the open end of the recess, surfaces 25 and 26 are provided with oppositely inclined surface portions 28, 30 which act as a guide to facilitate a wire being inserted into the recess.

At spaced locations along surfaces 25 and 26 are a plurality of aligned oppositely, orientated transverse channel pairs illustrated here as two channel pairs 32, 34 and 36, 38 respectively. The channels may have angular or semi-circular cross-sections. The channel pairs are adapted to receive a wire therein.

Manually spreading elements 20 and 22 apart permits a wire W to be received within the recess and, more particularly, within one of the channel pairs. The elements are biased toward each other. Releasing the elements 20, 22 causes same to return to their original relative positions thereby tightly clamping the elements around a wire situated within one of the channel pairs. Different channel pairs may be provided with different interior diameters to accommodate wire of different diameters.

The bias applied to the clamping elements may be a result of the resiliency of the connecting portion 24. It may be the result of the use of a torsion spring 40 embedded within the body of the clip in a cylindrical opening 42. In the embodiment of FIG. 2, both portion 24 and spring 40 contribute to the bias.

A plurality of openings 10 are provided through each of the elements 20 and 22 which intersect the channel pairs respectively. The openings 10 are adapted to to receive the pointed probe tip of tester B and are dimensioned so as to frictionally engage the probe tip and retain the tester in a substantially upright position. Openings 10 may be dimensioned in order to limit the movement of the probe tip towards the wire such that the wire is not severed. In addition, openings 10 may be dimensioned to receive different sized probe tips.

FIG. 3 illustrates a second preferred embodiment of the present invention. This embodiment also includes wire clamping elements 20 and 22, aligned channel pairs 32, 34 and 36, 38 (although this time illustrated as being semi-circular in cross-sectional dimension) and openings 10. However, this embodiment includes a pair of finger grip portions 44, 46 which extend from elements 20 and 22 respectively, on the opposite side of connecting portion 24. In addition, in this embodiment, torsion spring 40 has been replaced by a "C" shaped spring 48 embedded with in recess adjacent connecting portion 24.

Finger grip portions 44 and 46 are relatively moveable from a first position, wherein elements 20 and 22 are substantially parallel to each other and would clamp a wire therebetween and a second position in which finger grip portions 44 and 46 are moved towards each other so as to spread elements 20 and 22 apart to permit a wire to be received therebetween.

The interior surfaces of finger grip portions 44 and 46 are provided with a pair of oppositely extending stop elements 52, 54 which function to limit the extent to which the finger grip portions 44 and 46 can be moved towards each other. A compression spring 56, having a helical configuration, can be inserted between the interior surfaces of finger grip portions 44 and 46 and anchored on elements 52 and 54 so as to provide additional bias to spread finger grip elements 44 and 46 apart and thus maintain elements 20 and 22 in the clamping position.

FIG. 4 illustrates a third preferred embodiment of the present invention which has an integral molded plastic body, virtually identical in shape to the body of the second preferred embodiment, except that the C-shaped spring 48 and the recess therefor have been eliminated. This embodiment employs no external springs. The resiliency of the plastic material in connecting portion 24 alone serves to bias elements 20 and 22 toward the wire clamping position. The configuration of FIG. 4 or the configuration of FIG. 7 (which is similar thereto except for the elimination of elements 52 and 54) can be used in conjunction with an elastic encircling band 58, in the form of an "O" ring or the like, if additional bias force is required to securely clamp the clip to a wire.

FIG. 6 illustrates another preferred embodiment of the present invention which is similar in structure to the embodiments illustrated in FIGS. 3 and 4 except that clamping elements 20 and 22 are separate parts held together by spring 48 which acts as a hinge. Further, the contours of the elements are somewhat more rounded and the finger gripping portions 44, 46 are provided with grooved surfaces 60. It should be appreciated that a variety of different size and shaped clamping elements and finger grip portions can be provided within the scope of the invention.

FIG. 5 illustrates a "clothes pin" like configuration for the clip which includes a first element 61, which comprises a wire clamping portion 61a and a finger gripping 61b and a second element 62 which includes a wire clamping portion 62a and a finger gripping portion 62b. Parts 61 and 62 may be relatively rigid and hence made of good wood or rigid plastic or the like. A torsion spring 64 acts as a hinge and additionally to bias the wire portions 61a and 62a into the clamping position.

It will now be appreciated that the present invention relates to an electric wire clip adapted for use with a hand held circuit tester of the type having a pointed probe tip. The clip includes a first and second interconnected wire clamping elements which define a recess. The elements are moveable relative to each other between an open position, wherein the elements are spread apart and a closed position, wherein the elements are proximate each other and a wire may be clamped therebetween. The elements are biased towards the clamping position. The interior surfaces of the elements are provided with openings extending there through and intersecting the channels. The openings are adapted to receive the pointed probe tip so as to guide the tip through the wire inclusation and into the center of the wire. In addition, the clip will retain the tester in the test position so as to free the user's hands for other tasks.

While only a limited number of embodiments have been described herein for purposes of illustration it is obvious that many variations and modifications could be made thereto. It is intended to cover all of these variations and modifications which will in the scope of the present invention as defined in the following claims:

I claim:

1. An electric wire clip for use with a circuit tester having a pointed probe tip, the clip comprising first and second movably connected clamping elements defining a recess, said clamping elements being movable relative to each other between an open position, wherein the elements are spread apart, and a closed position, wherein the elements are proximate each other and a wire may be clamped therebetween, means for biasing said clamping elements toward said clamping position to retain the clip on the wire and means extending from said clamping elements for gripping between the fingers, said finger gripping means being movable toward each other by fingers, against the force of the biasing means, to move said clamping elements towards said open position, said means comprising oppositely oriented external surfaces for gripping by the fingers, one of said clamping elements having an opening extending therethrough and intersecting the recess, said opening being adapted to receive the pointed probe tip.

2. The clip of claim 1 further comprising means for moveably connecting said clamping elements.

3. The clip of claim 2 wherein said connecting means comprises hinge means.

4. The clip of claim 2 wherein said connecting means comprises a flexible connecting part.

5. The clip of claim 1 wherein the recess is defined by opposing interior surfaces of said clamping elements and further comprising a first pair of aligned channels in said opposing interior surfaces.

6. The clip of claim 6 further comprising a second pair of aligned channels on said opposing surfaces, said second pair of channels being spaced from said first pair of channels.

7. The clip of claim 6 wherein one of said channels is aligned with said opening.

8. The clip of claim 1 further comprising means for limiting the relative movement of said finger grip means toward said second position.

9. The clip of claim 1 further comprising means for limiting the relative movement of said finger grip means toward said second position.

10. The clip of claim 9 further comprising spring means interposed between said finger grip means.

11. The clip of claim 1 wherein said clamping elements comprise oppositely inclined interior surface portions.

12. The clip of claim 1 wherein said elements are composed of light transmissive material.

13. The clip of claim 1 further comprising elastic encircling means received over said clamping elements to retain same in said closed position.

14. The clip of claim 1 wherein said external surfaces are substantially planar and normally substantially parallel to each other.

15. The clip of claim 1 wherein said finger grip portions comprise interior surfaces between which said biasing means is mounted.

16. The clip of claim 15 wherein said biasing means comprises a coil spring and wherein said inner surfaces comprise protrusions for retaining said coil spring.

* * * * *